(12) United States Patent
Wu et al.

(10) Patent No.: US 10,157,850 B1
(45) Date of Patent: Dec. 18, 2018

(54) SEMICONDUCTOR PACKAGES AND MANUFACTURING METHOD THEREOF

(71) Applicant: Taiwan Semiconductor Manufacturing Co., Ltd., Hsinchu (TW)

(72) Inventors: Chih-Wei Wu, Yilan County (TW); Jing-Cheng Lin, Hsinchu (TW); Szu-Wei Lu, Hsinchu (TW); Ying-Ching Shih, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/662,292

(22) Filed: Jul. 28, 2017

(51) Int. Cl.
| | |
|---|---|
| *H01L 23/00* | (2006.01) |
| *H01L 23/538* | (2006.01) |
| *H01L 23/31* | (2006.01) |
| *H01L 25/10* | (2006.01) |
| *H01L 21/48* | (2006.01) |
| *H01L 21/56* | (2006.01) |
| *H01L 25/00* | (2006.01) |

(52) U.S. Cl.
CPC ...... *H01L 23/5389* (2013.01); *H01L 21/4853* (2013.01); *H01L 21/4857* (2013.01); *H01L 21/565* (2013.01); *H01L 23/3128* (2013.01); *H01L 23/5383* (2013.01); *H01L 23/5386* (2013.01); *H01L 25/105* (2013.01); *H01L 25/50* (2013.01); *H01L 2225/1035* (2013.01); *H01L 2225/1058* (2013.01)

(58) Field of Classification Search
CPC ............... H01L 23/49816; H01L 24/16; H01L 25/0657
See application file for complete search history.

(56) References Cited

U.S. PATENT DOCUMENTS

| | | |
|---|---|---|
| 9,000,584 B2 | 4/2015 | Lin et al. |
| 9,048,222 B2 | 6/2015 | Hung et al. |
| 9,048,233 B2 | 6/2015 | Wu et al. |
| 9,064,874 B2 | 6/2015 | Edelstein et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 2014/0151880 A1* | 6/2014 | Kao ........................ H01L 24/73 257/738 |
| 2015/0155267 A1* | 6/2015 | Hoegerl .............. H01L 25/0655 257/698 |

\* cited by examiner

*Primary Examiner* — Thomas L Dickey
(74) *Attorney, Agent, or Firm* — JCIPRNET

(57) ABSTRACT

A semiconductor package and a manufacturing method for the semiconductor package are provided. The semiconductor package has at least one die, conductive balls, and a molding compound. The at least one die and conductive balls are molded in a molding compound. Each of the conductive balls has a planar end portion and a non-planar end portion opposite to the planar end portion. A surface of the planar end portion of each of the conductive balls is substantially coplanar and levelled with a surface of the molding compound and a surface of the at least one die, and the non-planar end portion of each of the conductive balls protrudes from the molding compound.

20 Claims, 10 Drawing Sheets

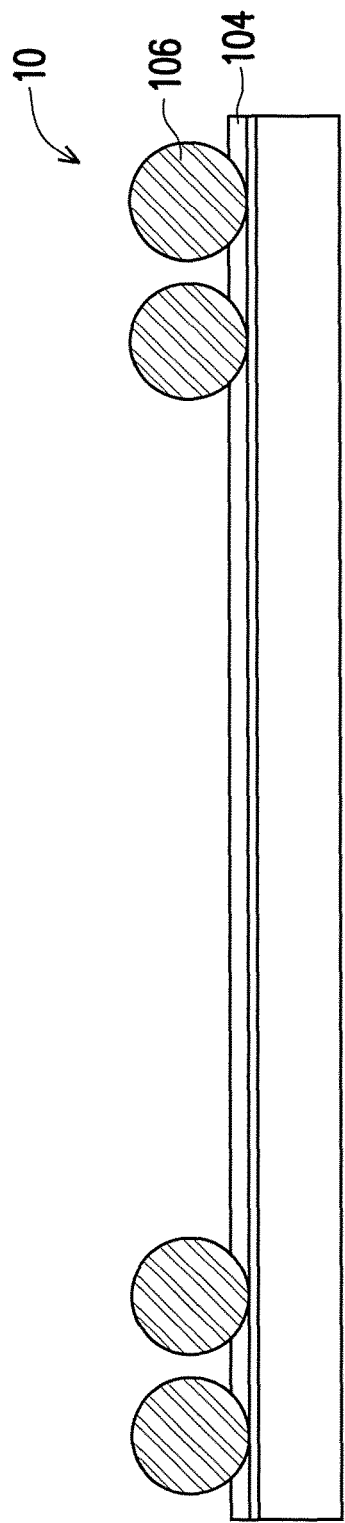
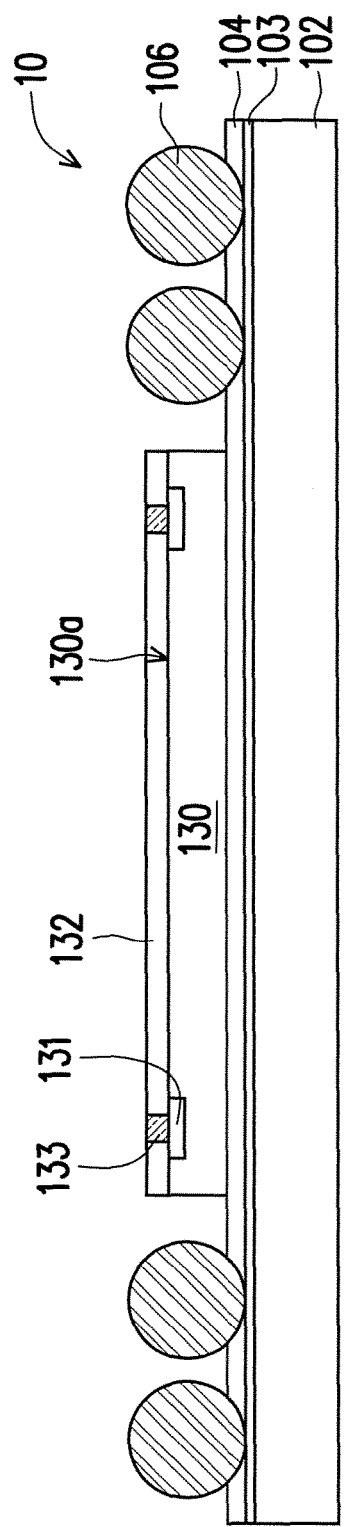
FIG. 1C
FIG. 1D

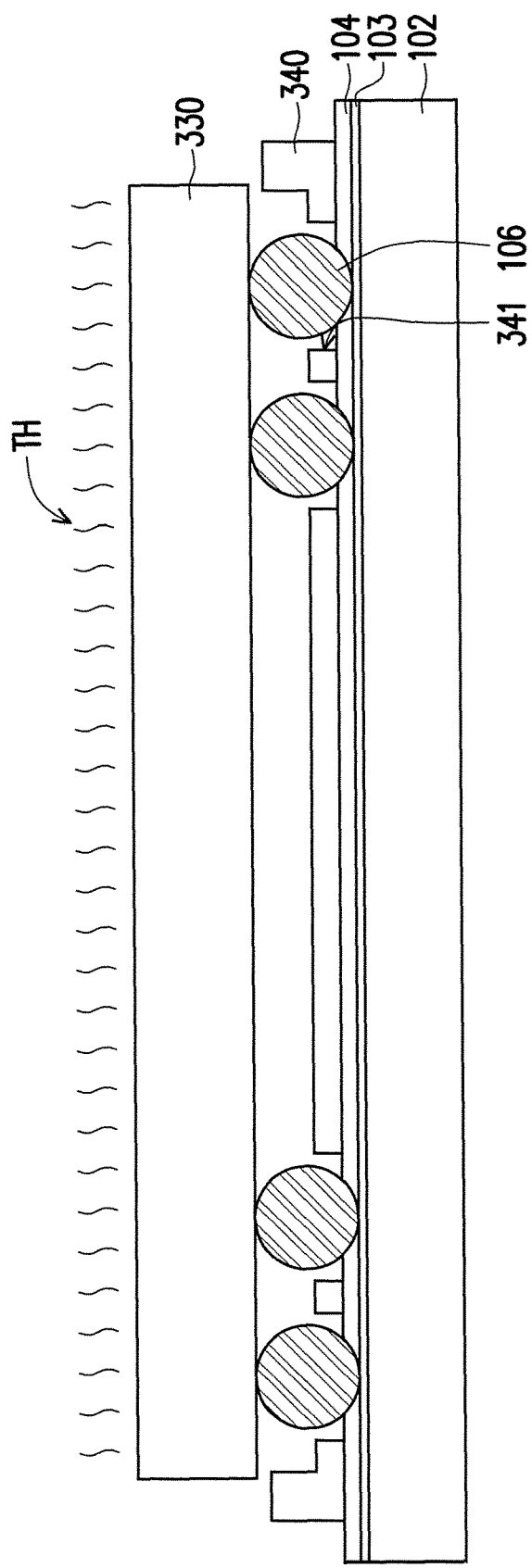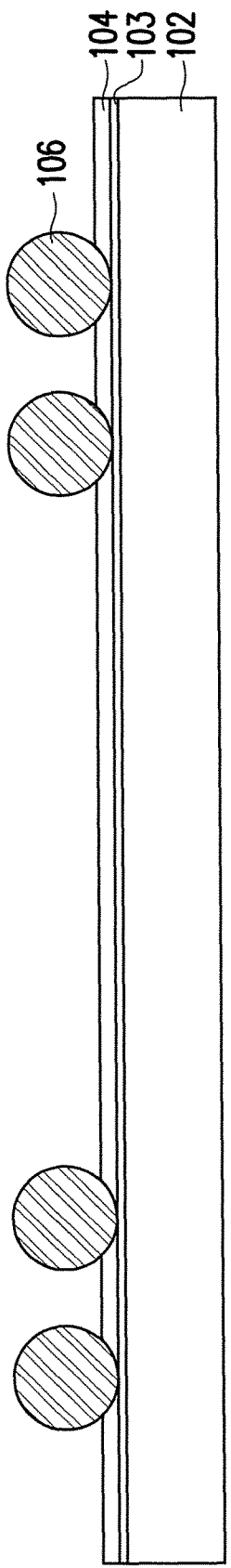
FIG. 4B
FIG. 4C

SEMICONDUCTOR PACKAGES AND MANUFACTURING METHOD THEREOF

BACKGROUND

The semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more of the smaller components to be integrated into a given area. As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A to FIG. 1J are schematic cross sectional views of various stages in a manufacturing method of a semiconductor package according to some exemplary embodiments of the present disclosure.

FIG. 4A to FIG. 4C are schematic cross sectional views of various stages in a manufacturing method of a semiconductor package according to some exemplary embodiments of the present disclosure.

DETAILED DESCRIPTION

Figure 1A:
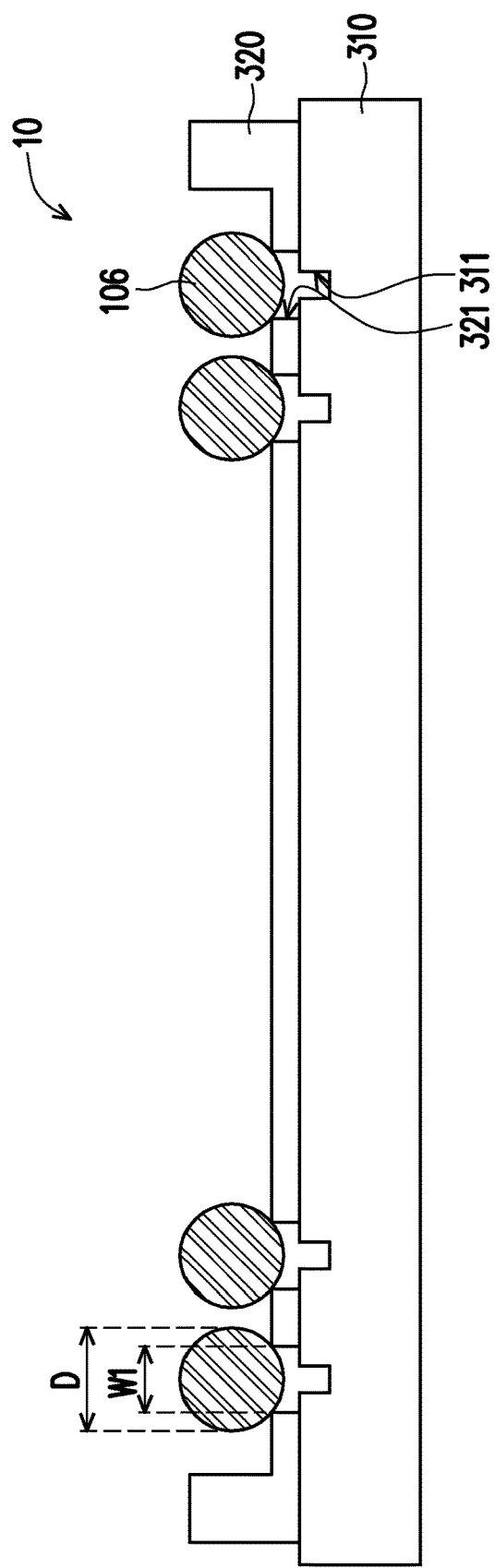

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 2:
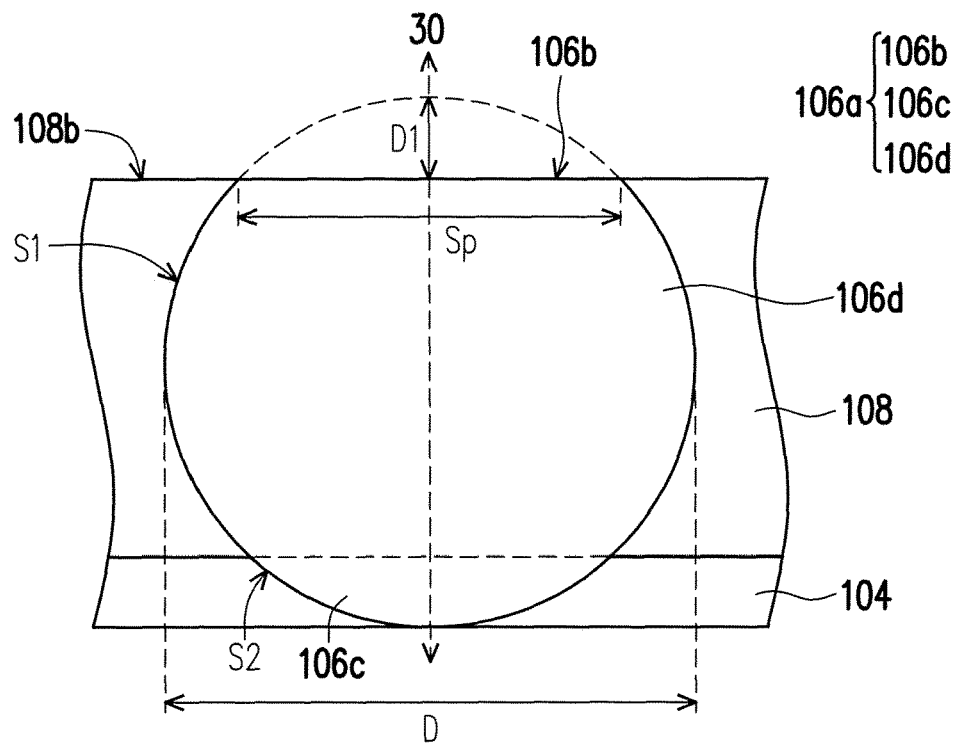
FIG. 2 is a schematic enlarged cross sectional view illustrating a part of the semiconductor package depicted in FIG. 1F.
Figure 3:
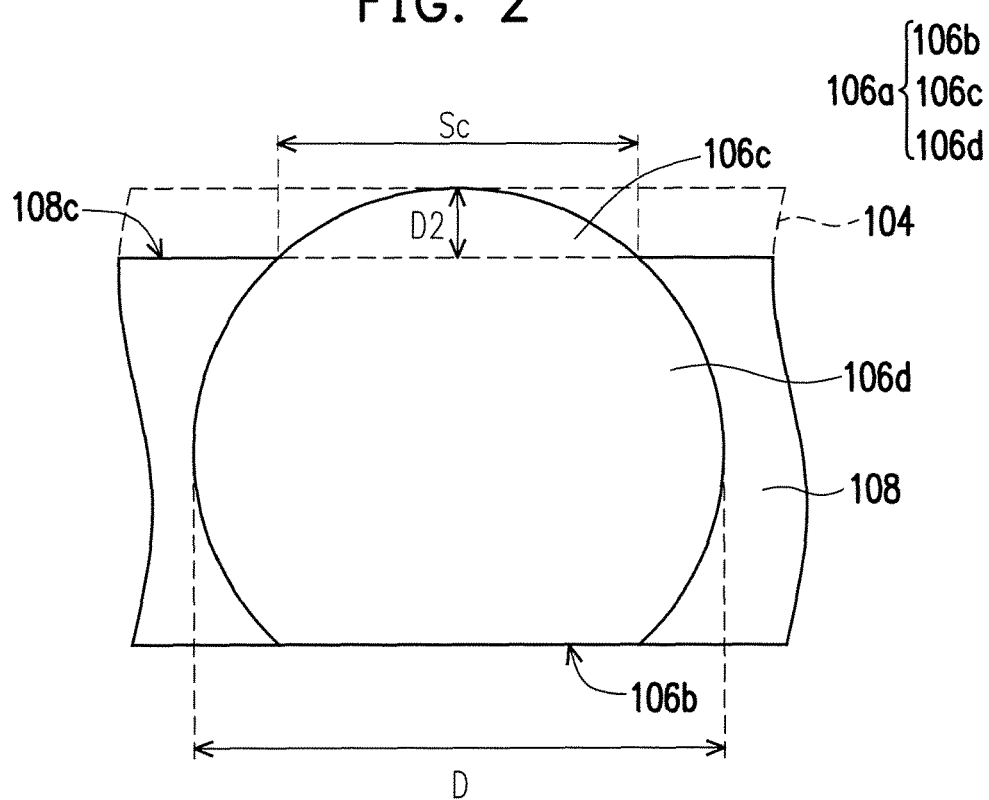
FIG. 3 is a schematic enlarged cross sectional view illustrating a part of the semiconductor package depicted in FIG. 1I.

FIG. 1A to FIG. 1J are schematic cross sectional views of various stages in a manufacturing method of a semiconductor package according to some exemplary embodiments of the present disclosure. FIG. 2 is a schematic enlarged cross sectional view illustrating a part of the semiconductor package depicted in FIG. 1F. FIG. 3 is a schematic enlarged cross sectional view illustrating a part of the semiconductor package depicted in FIG. 1I. In exemplary embodiments, the manufacturing method is part of a packaging process. In FIG. 1A to FIG. 1J, a semiconductor package 10 is shown to represent a package structure obtained following the manufacturing method, for example. In some embodiments, two chips or dies are shown to represent plural chips or dies of the wafer, and one or more packages are shown to represent plural semiconductor packages obtained following the semiconductor manufacturing method, the disclosure is not limited thereto.

Referring to FIG. 1A, in some embodiments, a supporting element 310 having a frame 320 disposed thereon is provided. The supporting element 310 has a plurality of openings 311, and the frame 320 has a plurality of openings 321 which are correspondingly in spatial communication with the openings 311 of the supporting element 310. In some embodiments, the openings 311 of the supporting element 310 are in spatial communication with the openings 321 of the frame 320, respectively. In one embodiment, the supporting element 310, for example, can include a chuck table (not shown) which might be made of any suitable material having enough mechanical strength to support the frame 310. In one embodiment, the frame 320, for example, can include a frame having mesh pattern, and the mesh pattern includes the openings 321. In certain embodiments, the locations of the openings 321 of the mesh pattern correspond to the locations of the to-be-placed balls.

As shown in FIG. 1A, in some embodiments, conductive balls 106 are placed at the openings 321 of the frame 320, respectively. In one embodiment, as shown in FIG. 1A, a size W1 of the openings 321 of the frame 320 is less than a diameter D of the conductive balls 106, but the disclosure is not limited thereto. In an alternative embodiment, the size W1 of the openings 321 of the frame 320 may be equal to the diameter D of the conductive balls 106. The conductive balls 106 are correspondingly aligned with the openings 321, respectively. In some embodiments, the conductive balls 106 can be, for example, metal balls, metal alloy balls, solder balls, ball grid array ("BGA") balls, or the like, or any one of the above that is further coated with solder materials. In some embodiments, the conductive balls 106 are solid round copper balls or copper alloy balls of a uniform size. In some embodiments, a shape of the conductive balls 106 may be spherical, elliptical, or the like, where the conductive balls 106 has a curved surface. In some embodiments, the openings 321 are round shaped openings. In other embodiments, the shape of the openings 321 may be square, rectangular or any suitable polygonal shape.

Figure 1B:
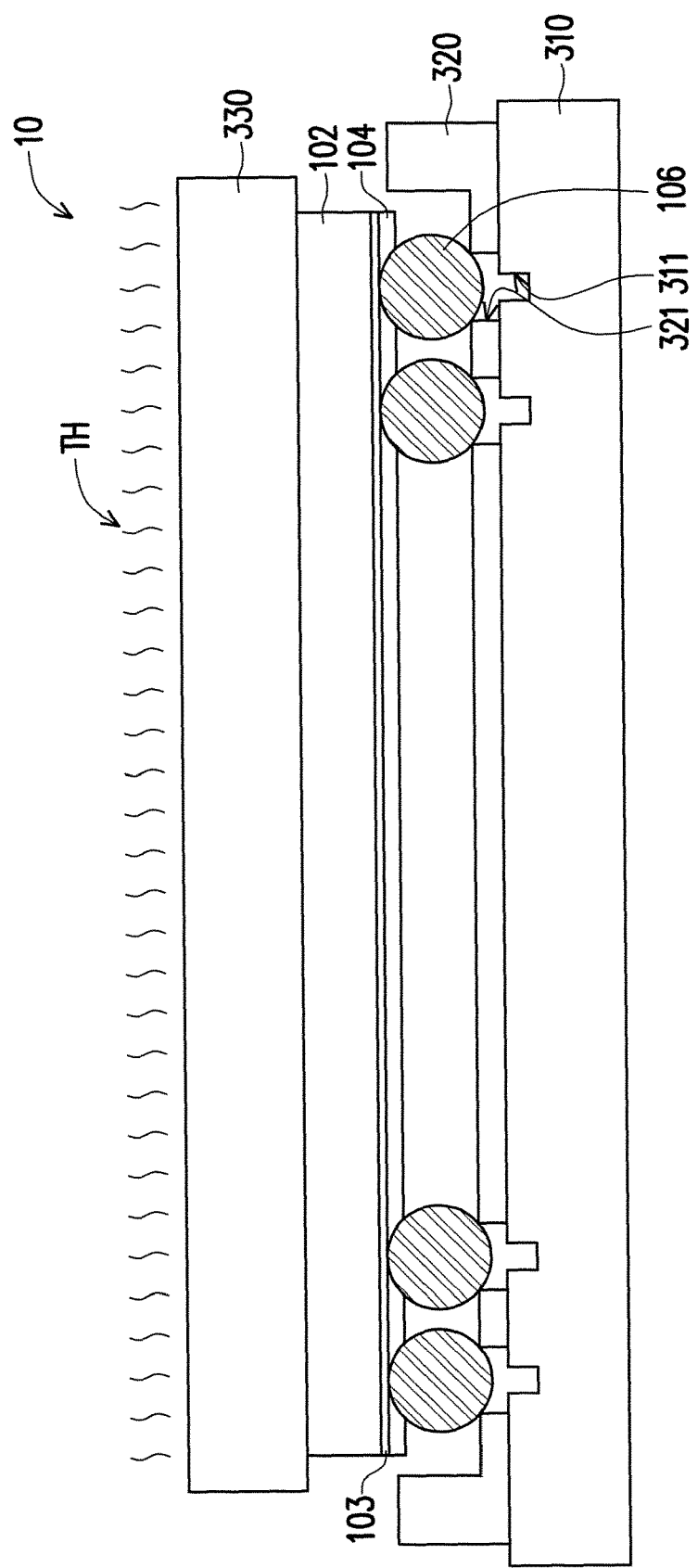

Referring to FIG. 1B, in some embodiments, a carrier 102 with a debond layer 103 and an adhesive layer 104 coated thereon is provided. In one embodiment, the carrier 102 may be a glass carrier or any suitable carrier for carrying a semiconductor wafer or a reconstituted wafer for the manufacturing method of the semiconductor package. In some embodiments, the debond layer 103 is disposed on the carrier 102, and the material of the debond layer 103 may be any material suitable for bonding and debonding the carrier 102 from the above layer(s) (e.g., the adhesive layer 104) or any wafer(s) disposed thereon. In some embodiments, the debond layer 103 includes a dielectric material layer made of a dielectric material including any other suitable polymer-based dielectric material (such as benzocyclobutene ("BCB"), polybenzooxazole ("PBO")), or any other suitable epoxy-based thermal-release material.

As shown in FIG. 1B, the adhesive layer 104 is disposed on the debond layer 103, and the debond layer 103 is located between the carrier 102 and the adhesive layer 104. In some embodiments, the adhesive layer 104 includes a die attach film. In an embodiment, the adhesive layer 104 may be formed of a polymer-based material, which may be removed along with the carrier 102 from the overlying structures that will be formed in subsequent steps. In an alternative embodiment, the adhesive layer 104 may be formed of an epoxy-based thermal-release material, which loses its adhesive property when heated, such as a light-to-heat-conversion (LTHC) release coating film. In a further alternative embodiment, the adhesive layer 104 may be formed of an ultra-violet (UV) glue, which loses its adhesive property when exposed to UV lights. The adhesive layer 104 may be dispensed as a liquid and cured or may be a laminate film laminated onto the debond layer 103, or may be the like. The top surface of the adhesive layer 104 may be levelled and may have a high degree of coplanarity. In some embodiments, the debond layer 103 and the adhesive layer 104 may be the same layer, where the debond layer 103 and the adhesive layer 104 are, for example, a LTHC layer, and such layer enables room temperature debonding from the carrier 102 by applying laser irradiation.

In certain embodiments, the carrier 102 is held by a head table 330 having a heating element (not shown), and the carrier 102 is placed over the conductive balls 106 through the head table 330. In some embodiments, the adhesive layer 104 directly contacts the conductive balls 106, and the conductive balls 106 are pressed into the adhesive layer 104 and contacts the surface of the debond layer 103. As shown in FIG. 1B, in some embodiments, a thermal treatment TH is performed on the carrier 102 through the head table 330, such that the adhesive layer 104 is adhered onto the conductive balls 106. In some embodiments, the conductive balls 106 penetrate through the adhesive layer 104, and each of the conductive balls 106 physically contacts the debond layer 103.

Referring to FIG. 1C, in some embodiments, the supporting element 310 and the frame 320 are removed from the conductive balls 106. In some embodiments, the head table 330 is removed from the carrier 102. As shown in FIG. 1C, the conductive balls 106 are disposed on the debond layer 103 and inlaid in the adhesive layer 104.

Referring to FIG. 1D, in some embodiments, at least one die 130 is provided. The die 130 is disposed on the adhesive layer 104. In exemplary embodiments, the die 130 may include one or more digital chips, analog chips or mixed signal chips, such as application-specific integrated circuit ("ASIC") chips, sensor chips, wireless and radio frequency chips, memory chips, logic chips or voltage regulator chips. In some embodiments, the die 130 is provided having contacts 131 disposed on an active side 130a of the die 130, a protection layer 132 exposing the contacts 131, and contacting posts 133 connected with the contacts 131. In some embodiments, the contacts 131 may include aluminum contact pads or the like. In some embodiments, a material of the protection layer 132 may include silicon oxide, silicon nitride, silicon oxynitride, or any suitable dielectric material. In some embodiments, a material of the contacting posts 133 includes copper and/or copper alloys, or the like. In some embodiments, the conductive balls 106 are arranged aside and surrounding the die 130, and the locations of the conductive balls 106 are arranged over a periphery region aside of and surrounding the positioning location of the die 130.

Figure 1E:
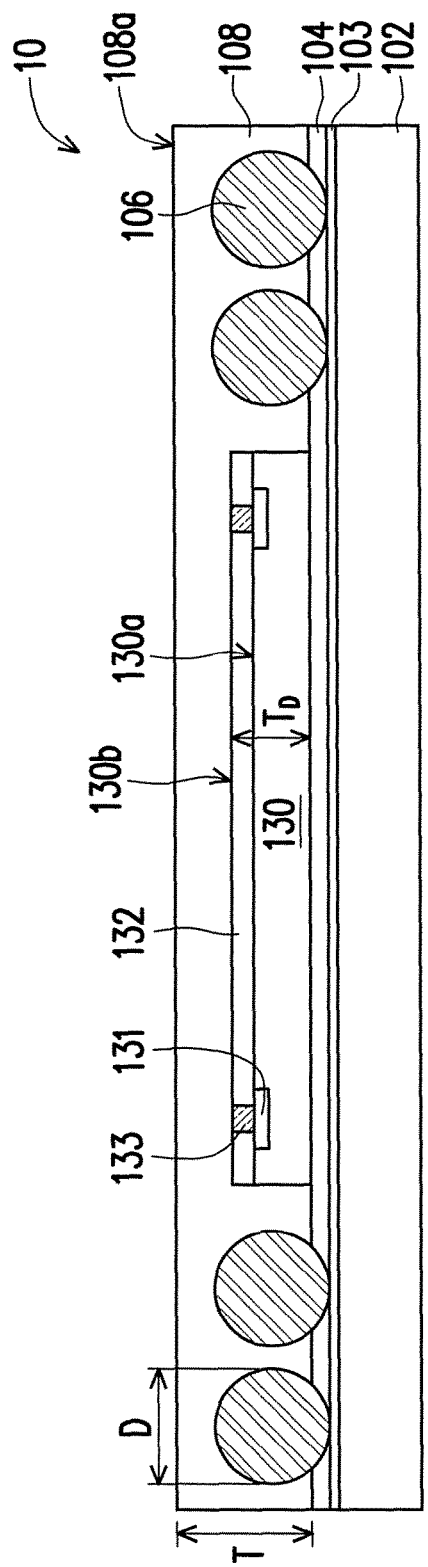

Referring to FIG. 1E, in some embodiments, a molding compound 108 is formed over the carrier 102, where the die 130 and the conductive balls 106 are molded in the molding compound 108. In some embodiments, the die 130 and the conductive balls 106 are covered by the molding compound 108. In other words, the die 130 and the conductive balls 106 are not revealed and embedded in the molding compound 108. In some embodiments, the thickness T of the molding compound 108 may be larger than the diameter D of the conductive balls 106 or the thickness $T_D$ of the die 130, and the die 130 and the conductive balls 106 are well-protected by the molding compound 108. That is, the top surface 108a of the molding compound 108 is higher than the top surface 130b of the die 130 or higher than the topmost end of the conductive balls 106. In some embodiments, the material of the molding compound 108 may include epoxy resins, phenolic resins or other suitable resins.

Figure 1F:
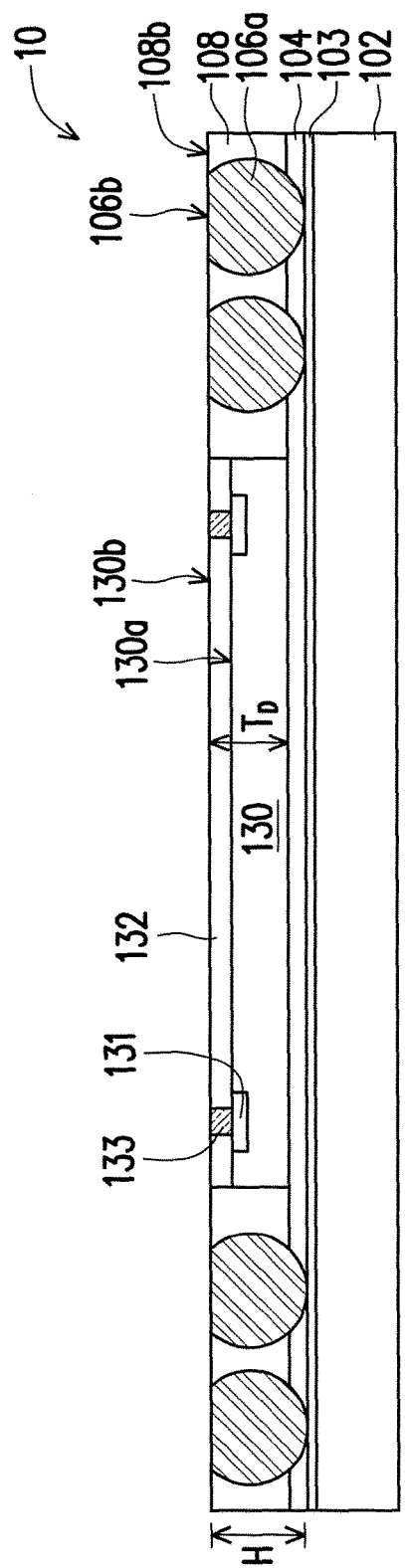

Referring to FIG. 1F, in some embodiments, the molding compound 108 is then planarized until the top surface 130b of the die 130 is exposed, and a top portion of each of the conductive balls 106 is removed to form planarized conductive balls 106a. In some embodiments, the molding compound 108 is, for example, planarized by mechanical grinding or fly cutting. As shown in FIG. 1F, after the planarization, the planarized conductive balls 106a are exposed from the top surface 108b of the planarized molding compound 108. In one embodiment, the planarized conductive balls 106a exposed from the top surface 108b of the planarized molding compound 108 are referred to as first portions 106b of the planarized conductive balls 106a. In some embodiments, in FIG. 1F, the top surfaces of the first portions 106b, the top surface 130b of the die 130, and the top surface 108b of the planarized molding compound 108 are substantially levelled and coplanar. Each first portion 106b is referred to a planar end portion of each planarized conductive ball 106a as shown in FIG. 1F. In some embodiments, the first portion 106b of each planarized conductive ball 106a may be, for example, a flat surface of each conductive ball 106a exposed by the top surface 108b of the planarized molding compound 108. In some embodiments, if considering the conductive balls 106 are round balls, the diameter D of the conductive balls 106 is larger than a height H of the planarized conductive balls 106a, see FIG. 1E and FIG. 1F. In some embodiments, the height H of the planarized conductive balls 106a is greater than a thickness $T_D$ of the die 130.

Referring to FIG. 1F and FIG. 2, certain structural features including the first portion 106b of the planarized conductive balls 106a, the adhesive layer 104 and the molding compound 108 are stressed for illustration purposes, and only one conductive ball 106a is shown in FIG. 2 for easy illustration. In exemplary embodiments, as shown in FIG. 2, the first portion 106b of the conductive ball 106a exposed by the top surface 108b of the planarized molding compound 108 is, for example, serving as a contact pad having a substantially circular shape (from top view) for electrically connections to later-formed layer(s) or element(s). In the disclosure, a diameter Sp of the first portion 106b is between 50 μm to 200 μm, a surface area of the first portion 106b is between $625\pi$ μm² to $10000\pi$ μm², and a diameter D of the planarized conductive ball 106a is between 50 μm to 200 μm. In detail, the diameter Sp of the first portion 106b is controllable by adjusting a grinding depth D1 of the conductive ball 106 (i.e., the amount of a removal portion (as indicated by a dot line) of the conductive ball 106 by the planarization in FIG. 1F). In some embodiments, if considering the conductive balls 106 are round balls, the grinding depth D1 is the difference between the diameter D of the conductive balls 106 and the height H of the planarized conductive balls 106a (i.e. D1=D−H). In some embodiments, the grinding depth D1 of the conductive ball 106 is about 2% to 3% of the diameter D of the planarized conductive ball 106a, where the diameter of the planarized conductive ball 106a equals to the diameter of the conductive ball 106. In one embodiment, the grinding depth D1 of the conductive ball 106 is about 3 μm, then the diameter Sp of the first portion 106b of the conductive elements 106a is about 50 μm, for example. In an alternative embodiment, the grinding depth D1 of the conductive ball 106 is about 13.4 μm, then the diameter Sp of the first portion 106b of the planarized conductive elements 106a is about 100 μm, for example. In a further alternative embodiment, the grinding depth D1 of the conductive ball 106 is about 33.8 μm, then the diameter Sp of the first portion 106b of the planarized conductive elements 106a is about 150 μm, for example. That is, the diameter Sp may be controlled by adjusting the grinding depth D1. Due to the uniform size of the conductive balls 106, a total height variation of the planarized conductive elements 106a is less than or equal to 2 μm, and such a small total height variation is beneficial for the later-formed layers. Through removing portions of the spherical conductive balls 106, the contact area between the planarized conductive balls 106a and the later-formed layers can be easily controlled and increased, thereby improving the reliability of electrical connection the planarized conductive balls 106a and the later-formed layers. In an alternative exemplary embodiment, additional conductive balls (not shown) may be mounted on the conductive balls 106, respectively, where the additional conductive balls can be mounted onto the corresponding planarized conductive balls 106a through a solder or reflow process. Namely, the disclosure is not limited to a single layer of the conductive balls or multiple layers of the conductive balls stacked on one another.

On the other hand, in FIG. 2, a middle portion 106d of the planarized conductive ball 106a in physical contact with the planarized molding compound 108 has a barrel-shape or a Chinese drum shape (e.g., a ball with two opposite end portions being cut off along a horizontal direction perpendicular to the symmetric axis 30 of the ball), where the sidewall S1 of the middle portion 106d of the planarized conductive ball 106a surrounded by the planarized molding compound 108 is in a form of a curved surface (having an arc shape in the cross-sectional view). The sidewall S1 of the middle portion 106d of the planarized conductive ball 106a is referred as a connecting interface of the planarized molding compound 108 and the planarized conductive ball 106a. In some embodiments, a lateral distance between the sidewall S1 and a symmetric axis 30 of the planarized conductive ball 106a varies along a direction of the symmetric axis 30, and the lateral distance is a distance taken along the horizontal direction perpendicular to the symmetric axis 30. As shown in FIG. 2, along the direction of the symmetric axis 30, the lateral distance between the sidewall S1 and the symmetric axis 30 of the planarized conductive ball 106a firstly increases and then decreases. In some embodiments, when the conductive ball 106 is a round ball, the maximum value of the lateral distance between the sidewall S1 and the symmetric axis 30 of the planarized conductive ball 106a is about half of the diameter D of the conductive ball 106.

Similarly, as shown in FIG. 2, a second portion 106c of the planarized conductive ball 106a in physical contact with the adhesive layer 104 may be considered as an end-piece of a ball (e.g., one end portion of the ball measuring from a horizontal plane perpendicular to the symmetric axis of the ball, can be referred as a ball-end portion). The second portion 106c of the planarized conductive ball 106a that is wrapped by the adhesive layer 104 has a curved bottom surface S2 (having an arc shape in the cross-sectional view). The curved bottom surface S2 of the second portion 106c of the planarized conductive ball 106a is referred as a connecting interface of the adhesive layer 104 and the planarized conductive ball 106a. In some embodiments, a lateral distance between the curved bottom surface S2 and a symmetric axis 30 of the planarized conductive ball 106a varies along a direction of the symmetric axis 30. In one embodiment, the lateral distance between the curved bottom surface S2 and the symmetric axis 30 of the planarized conductive ball 106a increases along the direction of the symmetric axis 30. In an alternative embodiment, the lateral distance between the curved bottom surface S2 and the symmetric axis 30 of the planarized conductive ball 106a decreases along the direction of the symmetric axis 30. As shown in FIG. 2, the curved bottom surface S2 is concaved toward the portion of the planarized conductive ball 106a surrounded by the planarized molding compound 108, where the curved bottom surface S2 of the cut-ball portion of the planarized conductive ball 106a is connected to the sidewall S1 of the portion of the planarized conductive ball 106a surrounded by the planarized molding compound 108. As shown in FIG. 2, the planarized conductive ball 106 includes the first portion 106b, the middle portion 106d, and the second portion 106c.

Figure 1G:
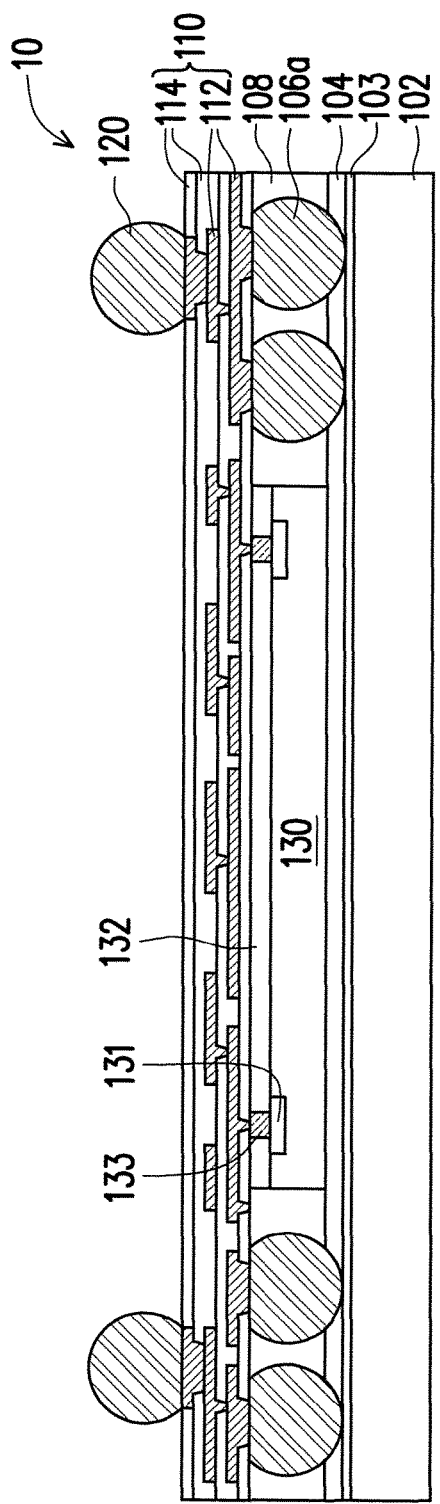

Referring to FIG. 1G, a redistribution layer 110 is formed on the planarized molding compound 108, the planarized conductive balls 106a and the die 130. In some embodiments, the redistribution layer 110 is a front-side redistribution layer electrically connected to the die 130 and is electrically connected to the planarized conductive balls 106a. In some embodiments, the redistribution layer 110 is electrically connected to the die 130 via the contacting posts 133 and the contacts 131. The formation of the redistribution layer 110 includes sequentially forming one or more metallization layers 112 and one or more polymer dielectric layers 114 in alternation. In certain embodiments, as shown in FIG. 1G, the metallization layers 112 are sandwiched between the polymer dielectric layers 114, where the top surface of the topmost layer of the metallization layers 112 is exposed by the topmost layer of the polymer dielectric layers 114, and the lowest layer of the metallization layers 112 is connected to the planarized conductive balls 106a and the contacting posts 133 of the die 130. In some embodiments, the material of the metallization layers 112 includes aluminum, titanium, copper, nickel, tungsten, and/or alloys thereof, and the metallization layers 112 may be formed by electroplating or deposition. In some embodiments, the material of the polymer dielectric layers 114 includes polyimide, epoxy resin, acrylic resin, phenol resin, benzocyclobutene (BCB), polybenzooxazole (PBO), or any other suitable polymer-based dielectric material, and the polymer dielectric layers 114 may be formed by deposition. In certain embodiments, as the underlying planarized conductive ball 106a and planarized molding compound 108 provide better planarization and evenness, the later-formed redistribution layer 110, especially the metallization layer with thin line width or tight spacing, can be formed with uniform linewidths or even profiles, resulting in improved line/wiring reliability.

Referring to FIG. 1G, conductive elements 120 are disposed on the redistribution layer 110. The conductive elements 120 are physically connected with the redistribution layer 110, and the conductive elements 120 are electrically connected to the redistribution layer 110. As shown in FIG. 1G, the redistribution layer 110 is located between the planarized molding compound 108 and the conductive elements 120. In some embodiments, the conductive elements 120 are, for example, solder balls or ball grid array (BGA) balls placed on the exposed topmost metallization layer 112 of the redistribution layer 110, and parts of the topmost metallization layer 112 underlying the conductive elements 120 function as under-ball metallurgy (UBM) layers. In some embodiments, prior to disposing the conductive elements 120, a solder paste (not shown) or flux is applied, so that the conductive elements 120 are better fixed to the topmost metallization layer 112. In some embodiments, some of the conductive elements 120 (not shown) are electrically connected to the die 130 through the redistribution layer 110, the contacting posts 133, and the contacts 131.

In some embodiments, a material of the planarized conductive balls 106a is the same as a material of the conductive elements 120, but the disclosure is not limited thereto. In an alternative embodiment, the material of the planarized conductive balls 106a may be different from the material of the conductive elements 120. In certain embodiments, the diameter D of the planarized conductive balls 106a is substantially equal to the diameter D' of the conductive elements 120. In an alternative embodiment, the diameter D of the planarized conductive balls 106a may be less than or greater than the diameter D' of the conductive elements 120.

Figure 1H:
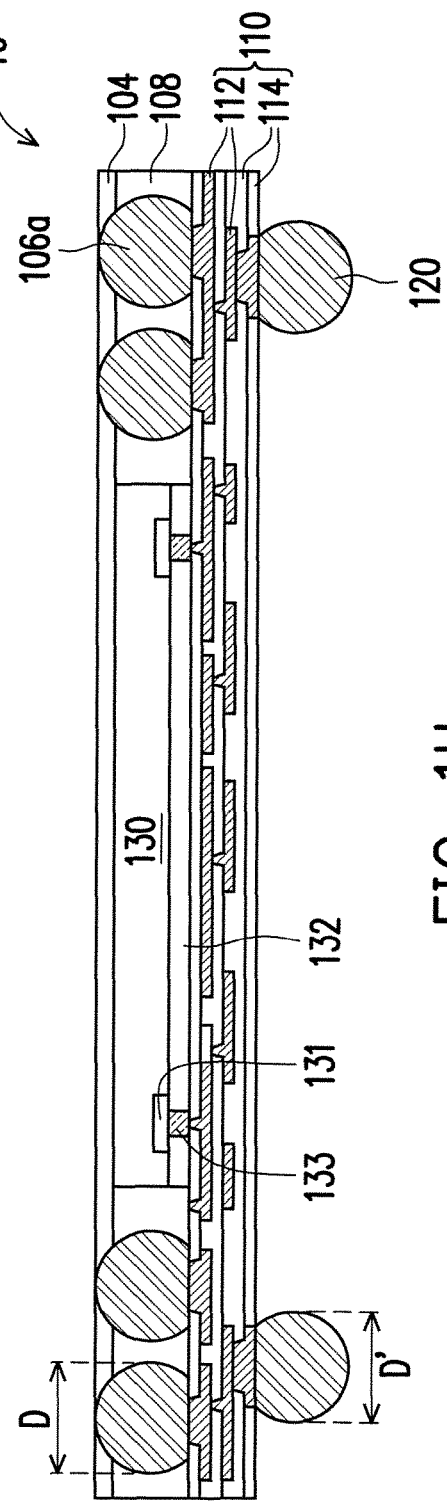

Referring to FIG. 1H, in some embodiments, the semiconductor package 10 is turned upside down, and the carrier 102 is debonded and separated from the adhesive layer 104. As shown in FIG. 1H, in some embodiments, the adhesive layer 104 is easily separated from the carrier 102 due to the debond layer 103, and the adhesive layer 104 is exposed.

Figure 1I:
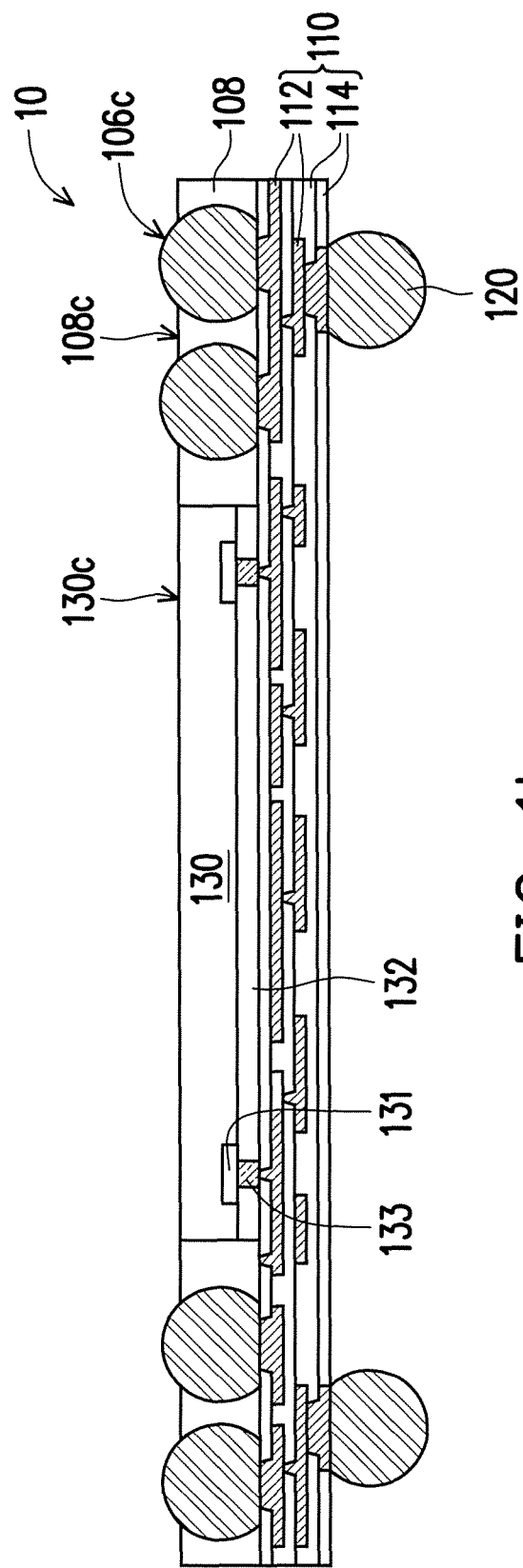

Referring to FIG. 1I, the adhesive layer 104 remained on the conductive balls 106a, the molding compound 108 and the die 130 is completely removed through a cleaning process, so that the second portion 106c of the planarized conductive balls 106a is exposed. In some embodiments, the clean process may include a wet etching process. As shown in FIG. 1I, in some embodiments, the second portion 106c of the planarized conductive balls 106a protrudes from a bottom surface 108c of the planarized molding compound 108 and is higher than a backside surface 130c of the die 130. The second portion 106c of the planarized conductive balls 106a is referred to a non-planar end portion (e.g. a protruded part) as shown in FIG. 1I. In certain embodiments, the second portion 106c is not covered by the planarized molding compound 108. In other words, the second portion 106c is protruded out of the planarized molding compound 108. In some embodiments, the second portion 106c of each conductive ball 106a may be, for example, a protrusion having a curved surface (e.g. a convex surface) from the bottom surface 108c of the molding compound 108. As shown in FIG. 3, the second portion 106c of the planarized conductive balls 106a is opposite to the first portion 106b of the conductive ball 106a along a thickness direction of the planarized molding compound 108, i.e. a direction extending along a thickness D2 of the adhesive layer 104 as shown in FIG. 3. In some embodiments, the second portion 106c (e.g. the curved bottom surface S2 depicted in FIG. 2) is treated as a convex surface relative to the bottom surface 108c of the planarized molding compound 108.

Referring to FIG. 1I and FIG. 3, certain structural features including the second portion 106c and the first portion 106b of the planarized conductive balls 106a, the adhesive layer 104 and the planarized molding compound 108 are stressed for illustration purposes, and only one planarized conductive balls 106a is shown in FIG. 3 for easy illustration. In exemplary embodiments, as shown in FIG. 3, the second portion 106c of the conductive ball 106a exposed by the bottom surface 108c of the planarized molding compound 108 is, for example, serving as a contact region having a substantially circular shape (from top view) for connecting another sub-package(s) or die(s). In the disclosure, a diameter Sc of the second portion 106c is between 100 µm to 150 µm, an area of the curved surface of the second portion 106c is between $1230\pi$ µm² to $4020\pi$ µm²; and a diameter D of the planarized conductive ball 106a is between 50 µm to 200 µm. In detail, the diameter Sc of the second portion 106c is controllable by adjusting the thickness D2 of the adhesive layer 104. In some embodiments, if considering the conductive balls 106 are round balls, the thickness D2 is the difference between the height H of the planarized conductive balls 106a and the thickness $T_D$ of the die 130 (i.e. D2=H−$T_D$). In one embodiment, the thickness D2 of the adhesive layer 104 is about 12.3 µm, then the diameter Sc of the second portion 106c is about 100 µm, for example. In an alternative embodiment, the thickness D2 of the adhesive layer 104 is about 26.8 µm, then the diameter Sc of the second portion 106c is about 150 µm, for example. That is, the diameter Sc may be controlled by adjusting the thickness D2 of the adhesive layer 104. Due to such configuration where the contact region of the planarized conductive balls 106a for connecting another sub-package(s) or die(s) can be easily controlled by adjusting the thickness of the adhesive layer 104, the reliability of electrical connection between the planarized conductive balls 106a and the another sub-package(s) or die(s) is improved. Up to here, the manufacture of the semiconductor package structure 10 is completed.

During the packaging processes, the semiconductor package structure 10 may be further mounted with additional packages, chips/dies or other electronic devices to form a PoP device.

Figure 1J:
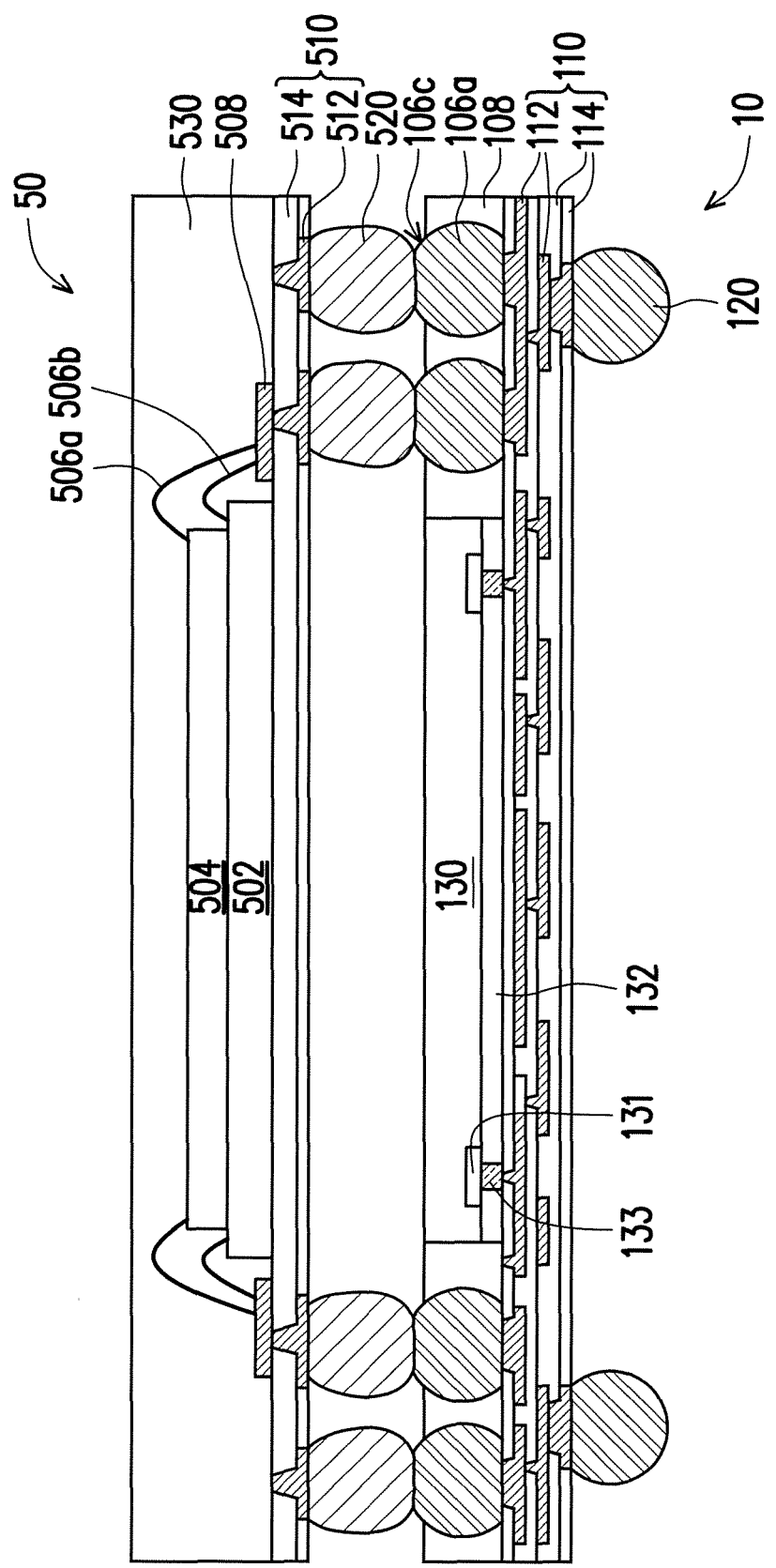

Referring to FIG. 1J, in some embodiments, at least one semiconductor sub-package 50 is provided. The semiconductor sub-package 50 is disposed on the semiconductor package 10. In some embodiments, the sub-package 50 includes a die 502, a die 504, wirings 506a, 506b, contact pads 508, at least one redistribution layer 510, connectors 520, and a molding compound 530. As shown in FIG. 1J, in some embodiments, the die 504 is stacked on the die 502, where the die 502 is electrically connected to the redistribution layer 510 through the wirings 506a and the contact pads 508 while the die 504 is electrically connected to the redistribution layer 510 through the wirings 506b and the contact pads 508. The die 502, the die 504, the wirings 506a, 505b, and the contact pads 508 are encapsulated in the molding compound 530. The redistribution layer 510 having at least one or more metallization layers and one or more polymer dielectric layers arranging in alternation is disposed on the molding compound 530. The connectors 520 are disposed on and electrically connected to the redistribution layer 510, where the redistribution layer 510 is located between the molding compound 530 and the connectors 520. In some embodiments, the semiconductor sub-package 50 is physically connected to the semiconductor package 10 through the connectors 520 and the planarized conductive balls 106a. As shown in FIG. 1J, the semiconductor sub-package 50 is disposed on the semiconductor package 10 by directly contacting the connectors 520 and the second portion 106c of the planarized conductive balls 106a exposed by the bottom surface 108c of the molding compound 108. In some embodiments, at least one of the die 502 and the die 504 is electrically connected to the die 130 and/or the conductive elements 120 through the redistribution layer 510, the connectors 520, the planarized conductive balls 106a and the redistribution layer 110. In an alternative embodiment, an underfill material (not shown) may be filled between the semiconductor sub-packages 50 and the semiconductor package 10. Up to here, the manufacture of the exemplary PoP device is completed, but the disclosure is not limited thereto.

Figure 4A:
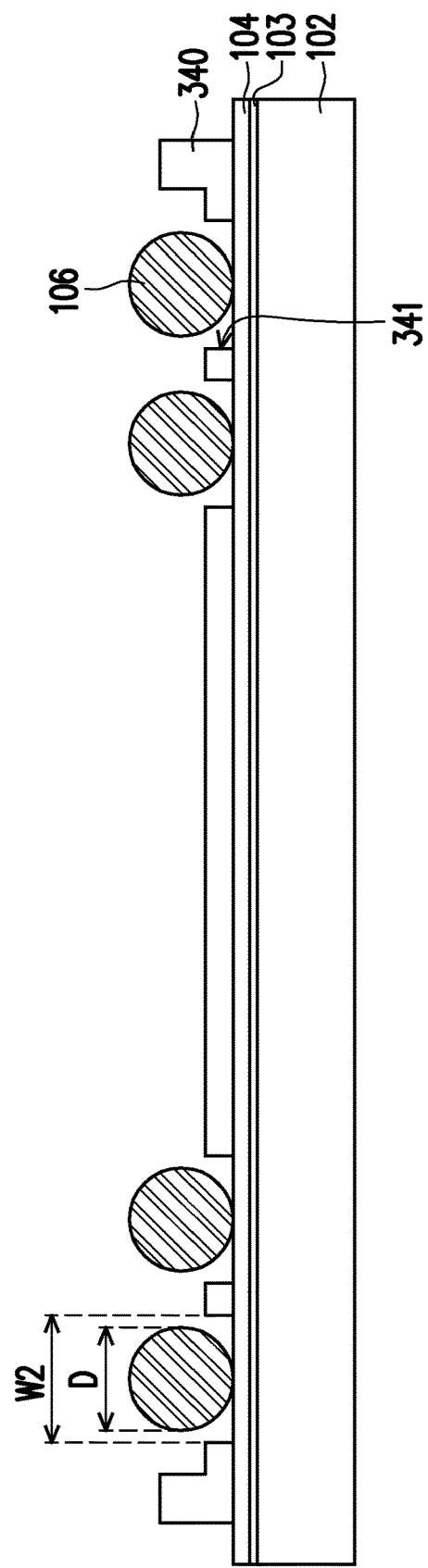

FIG. 4A to FIG. 4C are schematic cross sectional views of various stages in a manufacturing method of a semiconductor package according to some exemplary embodiments of the present disclosure. In some embodiments, the processes described in FIG. 1A to 1C can be substituted with the processes described in FIG. 4A to FIG. 4C. The elements similar to or substantially the same as the elements described above will use the same reference numbers, and certain details or descriptions of the same elements will not be repeated herein.

Referring to FIG. 4A, the carrier 102 is provided. As shown in FIG. 4A, a frame 340 having a plurality of openings 341 is provided and placed on the carrier 102. In one embodiment, the frame 340, for example, can include a frame having mesh pattern, where the mesh pattern includes the openings 341. In certain embodiments, the locations of the openings 341 of the mesh pattern correspond to the locations of the to-be-placed balls. As shown in FIG. 4A, the conductive balls 106 are placed at the openings 341 of the frame 340, respectively. That is, the conductive balls 106 are correspondingly aligned with the openings 341, respectively. In one embodiment, a size W2 of the openings 341 of the frame 340 is greater than a diameter D of the conductive balls 106. In some embodiments, the shape of the openings 341 can be the same as the shape of openings 321 depicted in FIG. 1A. In some embodiments, the shape of the openings 341 can be different from the shape of openings 321 depicted in FIG. 1A.

Referring to FIG. 4B, in some embodiments, the head table 330 having a heating element (not shown) is provided. As shown in FIG. 4B, the head table 330 is placed over the conductive balls 106. In some embodiments, a thermal treatment TH is performed on the conductive balls 106 through the head table 330, such that the adhesive layer 104 is adhered onto the conductive balls 106. In some embodiments, the conductive balls 106 penetrate through the adhesive layer 104, and each of the conductive balls 106 physically contacts the debond layer 103. In some embodiments, the adhesive layer 104 directly contacts the conductive balls 106, and the conductive balls 106 are pressed into the adhesive layer 104 and contacts the surface of the debond layer 103 as shown in FIG. 4B.

Referring to FIG. 4C, in some embodiments, the head table 330 and the frame 340 are removed from the conductive balls 106. As shown in FIG. 4C, the conductive balls 106 are disposed on the debond layer 103 and inlaid in the adhesive layer 104. Then, the previously described manufacturing process as described in in FIG. 1D-FIG. 1J above can be performed on the package structure depicted in FIG. 4C to obtain the semiconductor package 10 depicted in FIG. 1I and the exemplary PoP device depicted in FIG. 1J.

The configurations of the first portion and the second portion of the conductive balls provide flexibility in controlling the contact area between the conductive balls and other elements in the semiconductor package and between the conductive balls and other sub-package(s) or die(s), thereby improving the reliability of electrical connection therebetween. Additionally, the total height variation of the conductive balls is reduced, so that a larger process window for configurations of later-formed redistribution layers is obtained.

According to some embodiments, a semiconductor package includes at least one die, conductive balls, and a molding compound. The at least one die and conductive balls are molded in a molding compound. Each of the conductive balls has a planar end portion and a non-planar end portion opposite to the planar end portion. A surface of the planar end portion of each of the conductive balls is substantially coplanar and levelled with a surface of the molding compound and a surface of the at least one die, and the non-planar end portion of each of the conductive balls protrudes from the molding compound According to some embodiments, a semiconductor package includes at least one die, conductive balls, a molding compound, and a redistribution layer. The at least one die is embedded in the molding compound. The conductive balls are disposed aside of the at least one die and wrapped by the molding compound, wherein a non-planar portion of each of the conductive balls protrudes from a first side of the molding compound, and the non-planar portion has a convex surface relative to the first side of the molding compound. The redistribution layer is disposed on a second side of the molding compound and electrically connected to the at least one die and the conductive balls, wherein the first side and the second side are opposite sides of the molding compound.

According to some embodiments, a manufacturing method for a semiconductor package is provided. Conductive balls are disposed on a carrier having an adhesive layer disposed thereon. The conductive balls are pressed into the adhesive layer, wherein the conductive balls penetrate through the adhesive layer. At least one die is disposed on the adhesive layer. The conductive balls and the at least one die are encapsulated in a molding compound. The molding compound is planarized and a portion of each of the conductive balls is removed. The adhesive layer is removed and exposes another portion of each of the conductive balls from the molding compound, wherein the another portion protrudes out of the molding compound and has a curved surface.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
a molding compound; and
at least one die and conductive balls molded in the molding compound, wherein a backside surface of the least one die is exposed,
wherein each of the conductive balls has a planar end portion and a non-planar end portion opposite to the planar end portion,
wherein a surface of the planar end portion of each of the conductive balls is substantially coplanar and levelled with a surface of the molding compound and a surface of the at least one die, and the non-planar end portion of each of the conductive balls protrudes from the molding compound.

2. The semiconductor package as claimed in claim 1, wherein a height of the conductive balls is greater than a thickness of the at least one die.

3. The semiconductor package as claimed in claim 1, further comprising:
a redistribution layer, disposed on the molding compound and electrically connected to the at least one die and the conductive balls; and
conductive elements, connected to the redistribution layer, wherein the redistribution layer is located between the molding compound and the conductive elements.

4. The semiconductor package as claimed in claim 1, wherein a lateral distance between a sidewall of each of the conductive balls and a symmetric axis of the conductive balls varies along a direction of the symmetric axis.

5. The semiconductor package as claimed in claim 1, further comprising a semiconductor sub-package disposed on the non-planar end portion of the conductive balls and electrically connected to the redistribution layer through the conductive balls.

6. A semiconductor package, comprising:
a molding compound;
at least one die embedded in the molding compound;
conductive balls disposed aside of the at least one die and wrapped by the molding compound, wherein a non-planar portion of each of the conductive balls protrudes from a first side of the molding compound, and the non-planar portion has a convex surface relative to the first side of the molding compound;
a redistribution layer disposed on a second side of the molding compound and electrically connected to the at least one die and the conductive balls, wherein the first side and the second side are opposite sides of the molding compound; and
a semiconductor sub-package having connectors and electrically connected to the at least one die, wherein the connectors of the semiconductor sub-package are disposed on the non-planar portions of the conductive balls.

7. The semiconductor package as claimed in claim 6, wherein each of the conductive balls comprises a planar portion opposite to the non-planar portion, and the planar portion of each of the conductive balls and the second side of the molding compound are levelled with each other.

8. The semiconductor package as claimed in claim 6, wherein a height of the conductive balls is greater than a thickness of the at least one die.

9. The semiconductor package as claimed in claim 6, wherein a lateral distance between a sidewall of each of the conductive balls and a symmetric axis of the conductive balls varies along a direction of the symmetric axis.

10. The semiconductor package as claimed in claim 6, wherein the semiconductor sub-package is electrically connected to the redistribution layer through the conductive balls and the connectors.

11. A manufacturing method for a semiconductor package, comprising:
disposing conductive balls on a carrier having an adhesive layer disposed thereon;
pressing the conductive balls into the adhesive layer, wherein the conductive balls penetrate through the adhesive layer;
disposing at least one die on the adhesive layer;
encapsulating the conductive balls and the at least one die in a molding compound;
planarizing the molding compound and removing a portion of each of the conductive balls; and
removing the adhesive layer and exposing another portion of each of the conductive balls and a backside surface of the at least one die from the molding compound, wherein the another portion protrudes out of the molding compound and has a curved surface.

12. The method as claimed in claim 11, after planarizing the molding compound, further comprising:
forming a redistribution layer on the molding compound, on the conductive balls, and on the at least one die; and
disposing conductive elements on the redistribution layer.

13. The method as claimed in claim 11, after removing the adhesive layer, further comprising:
providing at least one semiconductor sub-package; and
disposing the at least one semiconductor sub-package onto the conductive balls.

14. The method as claimed in claim 13, wherein the at least one semiconductor sub-package comprises connectors, and the at least one semiconductor sub-package is electrically connected to the at least one die by directly contacting the connectors and the exposed portions of the conductive balls.

15. The method as claimed in claim 11, wherein disposing the conductive balls on the carrier comprises:
providing a supporting element having a frame thereon, wherein the frame has a plurality of first openings, wherein a size of the first openings is less than or equal to a diameter of the conductive balls;

placing the conductive balls at the first openings, respectively;

placing the carrier over the conductive balls, wherein the adhesive layer contacts the conductive balls and is between the carrier and the conductive balls; and removing the supporting element from the conductive balls.

16. The method as claimed in claim 15, wherein the first openings are arranged over a periphery region aside of and surrounding the at least one die.

17. The method as claimed in claim 11, wherein disposing the conductive balls on the carrier comprises:

providing a frame having a plurality of second openings on the carrier, wherein a size of the second openings is greater than a diameter of the conductive balls;

placing the conductive balls into the second openings, respectively; and removing the frame from the conductive balls.

18. The method as claimed in claim 17, wherein the second openings are arranged over a periphery region aside of and surrounding the at least one die.

19. The method as claimed in claim 11, wherein pressing the conductive balls into the adhesive layer further comprises:

performing a thermal treatment, wherein the adhesive layer is adhered onto the conductive balls with a surface profile corresponding to the conductive balls.

20. The method as claimed in claim 11, wherein planarizing the molding compound and removing a portion of each of the conductive balls comprises performing mechanical grinding or fly cutting.

\* \* \* \* \*